United States Patent [19]

Frechet et al.

[11] Patent Number: 4,657,845

[45] Date of Patent: Apr. 14, 1987

[54] POSITIVE TONE OXYGEN PLASMA DEVELOPABLE PHOTORESIST

[75] Inventors: Jean M. J. Frechet, Ottawa, Canada; Hiroshi Ito, San Jose, Calif.; Scott A. MacDonald, San Jose, Calif.; Carlton G. Willson, San Jose, Calif.

[73] Assignee: International Business Machines Corporation, Armonk, N.Y.

[21] Appl. No.: 818,584

[22] Filed: Jan. 14, 1986

[51] Int. Cl.⁴ .................. G03C 5/00; B44C 1/22
[52] U.S. Cl. .................. 430/326; 430/328; 430/330; 430/394; 156/628; 156/643
[58] Field of Search ............ 430/326, 328, 394, 330; 156/628, 643

[56] References Cited

U.S. PATENT DOCUMENTS

| | | | |
|---|---|---|---|
| 4,396,704 | 8/1983 | Taylor | 430/311 |
| 4,426,247 | 1/1984 | Tamamura et al. | 156/643 |
| 4,433,044 | 2/1984 | Meyer et al. | 430/271 |
| 4,481,279 | 11/1984 | Maito | 430/280 |
| 4,491,628 | 1/1985 | Ito et al. | 430/176 |
| 4,507,331 | 3/1985 | Hiraoka | 427/38 |
| 4,596,761 | 6/1986 | Brault | 430/296 |
| 4,613,398 | 9/1986 | Chiong et al. | 156/628 |

OTHER PUBLICATIONS

IBM Technical Disclosure Bulletin, vol. 27, No. 4A, Sep. 1984, "Positive-Tone Polymer Pattern Fabrication by Gas Phase Surface Modification, p. 2197.

Primary Examiner—John E. Kittle
Assistant Examiner—José G. Dees
Attorney, Agent, or Firm—Joseph G. Walsh

[57] ABSTRACT

A positive tone photoresist is obtained without a solvent development step. The resist is a polymer containing masked reactive functionality which is imagewise exposed to unmask the functionality then treated with a non-organometallic reagent to remask that functionality. Following flood exposure, the resist is treated with an organometallic reagent containing an element which forms a non-volatile oxide. It is then developed by means of oxygen reactive ion etching.

10 Claims, 1 Drawing Figure (1) COAT RESIST, IMAGEWISE EXPOSE & BAKE
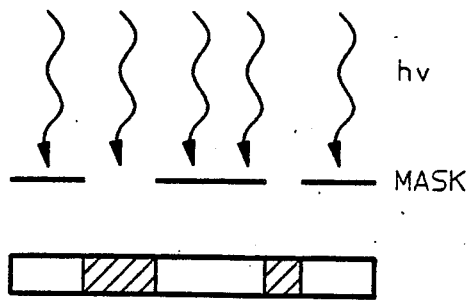
(2) TREAT WITH NON-ORGANOMETALLIC REAGENT
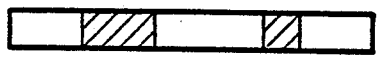
(3) FLOOD EXPOSE & BAKE
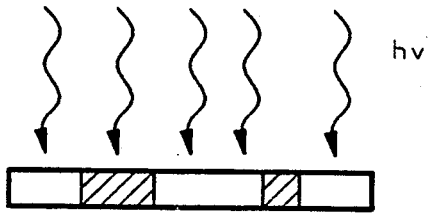
(4) TREAT WITH ORGANOMETALLIC REAGENT
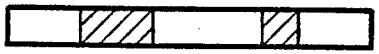
(5) DEVELOP RELIEF IMAGE IN $O_2$ PLASMA
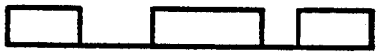

POSITIVE TONE OXYGEN PLASMA DEVELOPABLE PHOTORESIST

DESCRIPTION

1. Technical Field

The present invention is a process for generating a positive tone photoresist that is developed in an oxygen plasma. The process does not use the typical solvent development step found in most procedures.

2. Background Art

Negative tone plasma developable resist systems have been known for several years. In contrast, positive tone dry developable systems are of recent origin. Examples of such systems include those shown in U.S. Pat. Nos. 4,433,044, 4,426,247, 4,507,331 and 4,481,279. Another example of such a system is shown in the IBM TECHNICAL DISCLOSURE BULLETIN, Vol. 27, No. 4A, September, 1984, p. 2197. All of these references use materials and process steps different from those of the present invention.

DISCLOSURE OF THE INVENTION

In the process of the present invention, a resist is imagewise exposed (for example through a mask) and then treated with a reactive non-organometallic species. It is then flood exposed and treated with a reactive organometallic species. The next step is development in an oxygen plasma to produce a positive tone relief image of the mask.

The substrate is initially covered with a polymer which contains a masked reactive functionality. Such polymers are shown, for example, in U.S. Pat. No. 4,491,628. The polymers of that patent are preferred materials for use in the process of the present invention. They include, for example, the most preferred material, namely, poly(p-tert-butoxycarbonyloxystyrene) (t-Boc). Alternative structures will be easily recognized by those skilled in the art.

When the polymer containing such a masked reactive functionality is exposed in an imagewise fashion to radiation, such as, ultraviolet light, the exposed portions are unmasked, i.e., the portions of the polymer which have been struck by light have the reactive functionality uncovered. In the next step, this uncovered functionality is treated with a non-organometallic species which reacts with it. The polymer is next flood exposed and processed to unmask the reactive functionality which remains in the polymer. The polymer is next treated with an organometallic material containing an element such as tin or silicon which forms a non-volatile oxide. Finally, the system is developed by oxygen reactive ion etching to obtain a positive tone relief image.

DESCRIPTION OF THE DRAWING

Understanding of the invention may be facilitated by reference to the accompanied drawing which schematically outlines the steps of the process of the present invention. As may be seen from the drawing, a substrate is coated with a resist which is imagewise exposed to radiation. It is then peferably baked. It is next treated with a non-organometallic reagent and flood exposed to radiation, such as ultraviolet light. Another baking step may or may not be desired at this point. It is then treated with an organometallic reagent and then the relief image is developed by oxygen plasma etching.

The present invention has the advantage of using no solvent development step as is the case in most procedures. The avoidance of solvent development minimizes problems of lateral line development, loss of resist adhesion and the difficulties associated with solvent waste disposal and has the potential of reducing defect levels.

The choice of the non-organometallic species used to cover the unmasked functionality will, of course, be dependent upon the particular resist used. For use with the t-Boc system, the preferred non-organometallic species is an alkyl or aryl isocyanate. This reaction may or may not require simultaneous addition of a catalyst. Tertiary amines are useful catalysts for the isoyanate reaction.

Many organometallic species which form non-volatile oxides are well known to the art. In particular, compounds containing silicon or tin are preferred and most particularly, the compound hexamethyldisilazane (HMDS) is very useful.

As mentioned previously, compounds containing masked reactive functionality are shown, for example, in U.S. Pat. No. 4,491,628. That patent shows a particular type of preferred material, namely, a polymer having recurrent pendant groups that undergo acidolysis. As shown in that patent, it may be desirable to add to the polymer resist a material that generates acid upon radiolysis. The radiation generated acid can be used to assist in the unmasking of the reactive functionality, and a post exposure heat treatment is often used to enhance the acidolysis. A variety of related structures are known to be easily removed by acid catalysis. These include the structures described in Smith U.S. Pat. No. 4,491,628; and related materials which are susceptible to $A_{AL}1$ type of hydrolysis. ("Structure and Mechanism in Organic Chemistry", Ingold, pp. 752–754, Cornell University Press, Ithaca, N.Y., 1953)

EXAMPLE OF PREFERRED PROCESS (1) Spin coat wafer with a resist of poly(p-tert-butoxycarbonyloxystyrene) containing 18% by weight of the sensitizer triphenylsulfonium hexafluoroarsenate and bake for 15 minutes at 100° C.

(2) Expose through mask to a dose of approximately 6 mJ/cm$^2$ at 254 nm.

(3) Bake at approximately 100° C. for approximately two minutes.

(4) Place into a vacuum oven (at approximately 115° C.) and evacuate.

(5) Inject a mixture of triethylamine and methyl isocyanate into the vacuum oven so that the pressure rises to approximately 100 torr and let stand for twenty minutes.

(6) Pump out the triethylamine and methyl isocyanate; remove the substrate and flood expose the wafer with approximately 6 mJ/cm$^2$ at 254 nm.

(7) Bake at approximately 100° C. for approximately two minutes.

(8) Place into a vacuum oven (at approximately 115° C.) and evacuate.

(9) Inject hexamethyldisilazane (HMDS) into the vacuum oven so that the pressure rises to approximately 80-100 torr and let stand for approximately two minutes.

(10) Pump out the HMDS and remove the substrate.

(11) Place into a Tegal parallel plate etch tool and etch with 100 watts RF, 20 SCCM O$_2$, at 90 mTorr for fifteen minutes.

Final Film Thickness—1.2$\mu$.

Starting Film Thickness—1.25μ.

In this Example, deep ultraviolet light was used as the radiation source. However, the t-Boc/onium salt system can be dye sensitized to both mid and near ultraviolet and the system is known to be sensitive to both x-rays and electron beams.

Triphenylsulfonium hexafluoroantimonate should be mentioned as a very useful sensitizer.

We claim:

1. A process for producing a positive tone oxygen plasma developable photoresist, said process comprising the steps of:
   (1) coating a substrate with a polymer containing a masked reactive functionality,
   (2) exposing to radiation and processing said polymer in an imagewise manner to unmask selected portions of said reactive functionality,
   (3) treating the polymer with a non-organometallic species which reacts with the unmasked functionality,
   (4) flood exposing to radiation the polymer and processing it to unmask the reactive functionality which remains in the polymer,
   (5) treating the polymer with an organometallic material containing an element which forms a non-volatile oxide, and
   (6) developing the system by oxygen etching to obtain a positive tone relief image.

2. A process as claimed in claim 1, wherein the polymer with masked reactive functionality has recurrent pendant groups that undergo acidolysis.

3. A process as claimed in claim 1, wherein the non-organometallic species is an isocyanate.

4. A process as claimed in claim 1, wherein the organometallic species is a silicon compound.

5. A process as claimed in claim 1, wherein the organometallic species is a tin compound.

6. A process as claimed in claim 4, wherein the silicon compound is hexamethyldisilazane.

7. A process as claimed in claim 4, wherein the silicon compound is N,N-Dimethylaminotrimethylsilane.

8. A process as claimed in claim 1, wherein the polymer is baked after imagewise exposure.

9. A process as claimed in claim 1, wherein a photoinitiator is added to the polymer resist to assist in the unmasking of the reactive functionality.

10. A process as in claim 9, wherein the photoinitiator is triphenylsulfonium hexafluoroarsenate or tripheylsulfonium hexafluoroantimonate.

* * * * *